US012681651B2

(12) United States Patent
Lee et al.

(10) Patent No.: US 12,681,651 B2
(45) Date of Patent: Jul. 14, 2026

(54) STORAGE CONTROLLER PERFORMING PARTIAL REFRESH OPERATION, STORAGE DEVICE INCLUDING THE SAME, AND METHOD OF OPERATING THE SAME

(71) Applicant: Samsung Electronics Co., Ltd., Suwon-si (KR)

(72) Inventors: Yunjae Lee, Suwon-si (KR); Sang-Wook Yoo, Suwon-si (KR); Bomi Kim, Suwon-si (KR); Hyunseok Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/980,690

(22) Filed: Dec. 13, 2024

(65) Prior Publication Data

US 2025/0355579 A1 Nov. 20, 2025

(30) Foreign Application Priority Data

May 17, 2024 (KR) ........................ 10-2024-0064471

(51) Int. Cl.
*G06F 12/00* (2006.01)
*G06F 3/06* (2006.01)
*G11C 11/406* (2006.01)

(52) U.S. Cl.
CPC .......... *G06F 3/0625* (2013.01); *G06F 3/0659* (2013.01); *G06F 3/0673* (2013.01); *G11C 11/40622* (2013.01)

(58) Field of Classification Search
CPC .... G06F 3/0625; G06F 3/0659; G06F 3/0673; G06F 3/0604; G06F 3/064; G06F 3/0647; G06F 3/0658; G06F 13/14; G06F 2212/1028; G11C 11/40622
USPC ......................................................... 711/105
See application file for complete search history.

(56) References Cited

U.S. PATENT DOCUMENTS

| | | | |
|---|---|---|---|
| 7,590,021 B2 | 9/2009 | Michalak et al. |
| 9,281,047 B2 | 3/2016 | Kim et al. |
| 10,437,499 B2 | 10/2019 | Lee et al. |
| 2007/0180187 A1 | 8/2007 | Olson et al. |

(Continued)

FOREIGN PATENT DOCUMENTS

| | | | | |
|---|---|---|---|---|
| JP | 2007-317176 A | 12/2007 | | |
| JP | 2017191594 A | * 10/2017 | ........... | G11C 11/406 |
| KR | 10-2005-0120344 A | 12/2005 | | |

*Primary Examiner* — Mardochee Chery
(74) *Attorney, Agent, or Firm* — Fish & Richardson P.C.

(57) ABSTRACT

Disclosed is a method of operating a storage controller which includes a volatile memory device. The method includes determining whether a low-power mode is available, based on validity bitmap information indicating invalidity of first data stored in a first memory region of a first sub-block of the volatile memory device and validity of second data stored in a second memory region of a second sub-block of the volatile memory device, overwriting the second data to the first memory region based on the validity bitmap information, in response to determining that the low-power mode is available, storing first mapping information including a fixed index value corresponding to the first memory region and a migration index value corresponding to the overwritten second data in a metadata table, and performing a partial refresh operation corresponding to the first sub-block after overwriting the second data.

20 Claims, 12 Drawing Sheets

(56) References Cited

U.S. PATENT DOCUMENTS

| | | | | |
|---|---|---|---|---|
| 2010/0274960 | A1* | 10/2010 | Lee ..................... | G06F 12/0607 |
| | | | | 711/170 |
| 2019/0066765 | A1 | 2/2019 | Lee et al. | |
| 2020/0098420 | A1* | 3/2020 | Li ......................... | G06F 3/0619 |
| 2023/0236762 | A1* | 7/2023 | Vaghasiya ............. | G06F 3/0659 |
| | | | | 711/154 |

* cited by examiner

Figure 2:
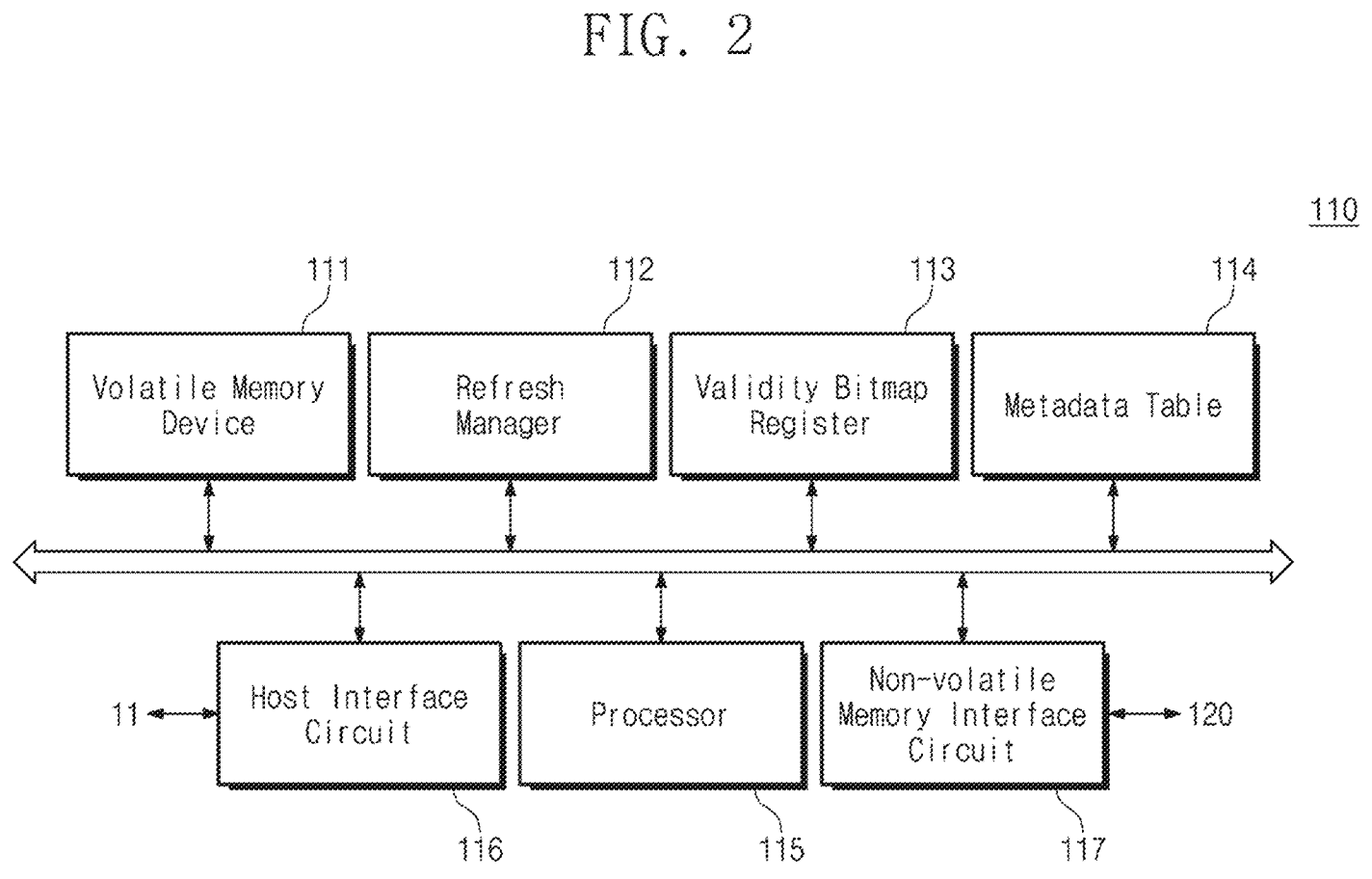

111 Volatile Memory Device

112 Refresh Manager

113 Validity Bitmap Register

114 Metadata Table

115 Processor

116 Host Interface Circuit

117 Non-volatile Memory Interface Circuit

STORAGE CONTROLLER PERFORMING PARTIAL REFRESH OPERATION, STORAGE DEVICE INCLUDING THE SAME, AND METHOD OF OPERATING THE SAME

CROSS-REFERENCE TO RELATED APPLICATIONS

This application claims priority under 35 U.S.C. § 119 to Korean Patent Application No. 10-2024-0064471 filed on May 17, 2024, in the Korean Intellectual Property Office, the disclosures of which are incorporated by reference herein in their entireties.

BACKGROUND

Example embodiments of the present disclosure described herein relate to a storage device, and more particularly, relate to a storage controller performing a partial refresh operation, a storage device including the same, and/or a method of operating the same.

A memory device stores data in response to a write request and outputs data stored therein in response to a read request. For example, the memory device is classified as a volatile memory device, which loses data stored therein when a power is turned off, such as a dynamic random access memory (DRAM) device or a static RAM (SRAM) device, or a non-volatile memory device, which retains data stored therein even when a power is turned off, such as a flash memory device, a phase-change RAM (PRAM), a magnetic RAM (MRAM), or a resistive RAM (RRAM).

When a volatile memory device is implemented with a DRAM, memory cells may temporarily store data. Each of the memory cells may include a capacitor having charges corresponding to a portion of data stored therein. Charges charged in the capacitor may be discharged over time. To maintain the reliability of stored data, a volatile memory device which is based on the DRAM may perform a refresh operation of compensating for the discharged charges. The refresh operation may cause power consumption.

SUMMARY

Example embodiments of the present disclosure provide a storage controller performing a partial refresh operation, a storage device including the same, and a method of operating the same.

According to an example embodiment, a method of operating a storage controller which includes a volatile memory device includes determining whether a low-power mode is available, based on validity bitmap information indicating invalidity of first data stored in a first memory region of a first sub-block of the volatile memory device and validity of second data stored in a second memory region of a second sub-block of the volatile memory device, a size of each of the first sub-block and the second sub-block being a minimum size capable of supporting a refresh operation of the volatile memory device, overwriting the second data to the first memory region based on the validity bitmap information, in response to determining that the low-power mode is available, storing first mapping information including a fixed index value corresponding to the first memory region and a migration index value corresponding to the overwritten second data in a metadata table, and performing a partial refresh operation corresponding to the first sub-block after overwriting the second data.

According to an example embodiment, a storage controller includes a volatile memory device that includes a first sub-block including a first memory region storing first data and a second sub-block including a second memory region storing second data, a validity bitmap register that stores validity bitmap information indicating invalidity of the first data and validity of the second data, a metadata table, and processing circuitry configured to implement a refresh manager. The refresh manager determines whether a low-power mode is available, based the validity bitmap information, overwrites the second data to the first memory region based on the validity bitmap information, in response to determining that the low-power mode is available, stores mapping information including a fixed index value corresponding to the first memory region and a migration index value corresponding to the overwritten second data in the metadata table, and performs a partial refresh operation corresponding to the first sub-block after overwriting the second data. A size of each of the first sub-block and the second sub-block is a minimum size capable of supporting a refresh operation of the volatile memory device.

According to an example embodiment, a storage device includes a non-volatile memory device, and a storage controller that stores user data in the non-volatile memory device. The storage controller includes a volatile memory device that includes a first sub-block including a first memory region storing first data and a second sub-block including a second memory region storing store second data, a validity bitmap register that stores validity bitmap information indicating invalidity of the first data and validity of the second data, a metadata table, and processing circuitry configured to implement a refresh manager. The refresh manager determines whether a low-power mode is available, based the validity bitmap information, overwrites the second data to the first memory region based on the validity bitmap information, in response to determining that the low-power mode is available, stores mapping information including a fixed index value corresponding to the first memory region and a migration index value corresponding to the overwritten second data in the metadata table, and performs a partial refresh operation corresponding to the first sub-block after overwriting the second data. The first data and the second data are temporarily buffered data of the user data or include logical-to-physical mapping information corresponding to the user data, and a size of each of the first sub-block and the second sub-block is a minimum size capable of supporting a refresh operation of the volatile memory device.

BRIEF DESCRIPTION OF THE FIGURES

The above and other objects and features of the present disclosure will become apparent by describing in detail example embodiments thereof with reference to the accompanying drawings.

FIG. 2 is a block diagram illustrating a storage controller of FIG. 1, according to some example embodiments of the present disclosure.

FIG. 3 is a diagram describing a full refresh operation of a conventional storage controller.

FIG. 11 is a block diagram of an electronic device according to some example embodiments of the present disclosure.

DETAILED DESCRIPTION

Below, example embodiments of the present disclosure will be described in detail and clearly to such an extent that one skilled in the art carries out example embodiments of the present disclosure easily.

Figure 1:
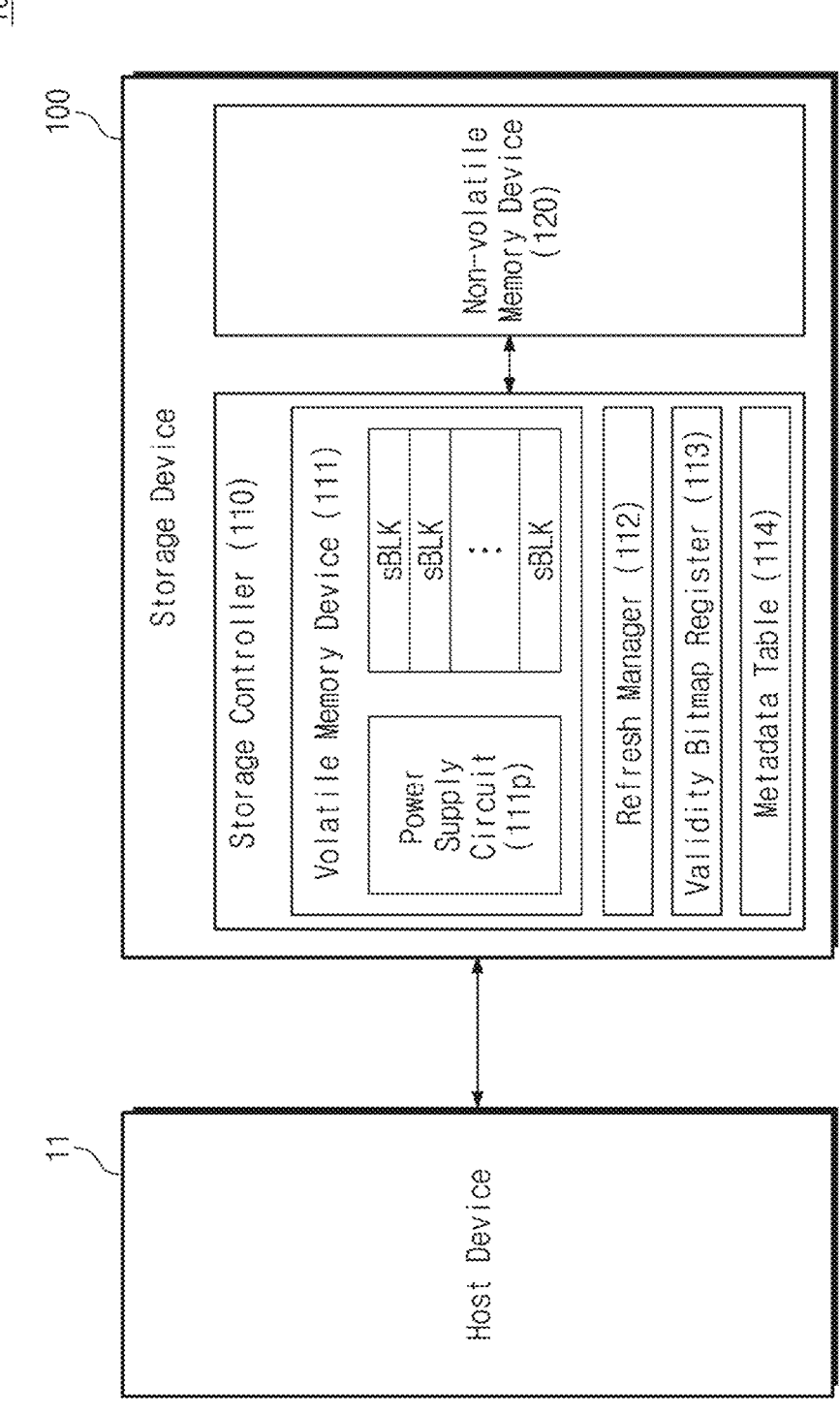
FIG. 1 is a block diagram of an electronic device according to an example embodiment of the present disclosure.

FIG. 1 is a block diagram of an electronic device according to an example embodiment of the present disclosure. Referring to FIG. 1, an electronic device 10 may include a host device 11 and a storage device 100. The electronic device 10 may be a computing system, which is configured to process a variety of information, such as a personal computer (PC), a notebook, a laptop, a server, a workstation, a tablet PC, a smartphone, a digital camera, and a black box, however, example embodiments are not limited thereto.

The host device 11 may control all the operations of the electronic device 10. For example, the host device 11 may store data in the storage device 100, may read data stored in the storage device 100, or may delete data stored in the storage device 100. The data stored in the storage device 100 may be also referred to as a "user data". In association with the storage device 100, the host device 11 may be also referred to as an "external host device".

The storage device 100 may include a storage controller 110 and a non-volatile memory device 120. Under control of the host device 11 or depending on an algorithm of internal firmware, the storage controller 110 may store data in the non-volatile memory device 120, may read the stored data, or may delete the stored data. A component which performs the algorithm of the internal firmware may be referred to as an "internal firmware module".

For example, based on a command indicating an operation (e.g., a program operation, a read operation, or an erase operation) to be performed on the non-volatile memory device 120 and an address indicating a location of data, the storage controller 110 may store the data in the non-volatile memory device 120 or may read the data stored in the non-volatile memory device 120.

The storage controller 110 may include a volatile memory device 111, a refresh manager 112, a validity bitmap register 113, and a metadata table 114. The volatile memory device 111 may be a dynamic random access memory (DRAM), such as error-correcting code (ECC) DRAM, synchronous DRAM (SDRM), a fast page mode DRAM, a double data rate SDRAM (DDR SDRAM), or the like.

The volatile memory device 111 may function as a buffer memory which temporarily buffers data received from the host device 11 or data received from the non-volatile memory device 120. The volatile memory device 111 may function as a logical-to-physical (L2P) mapping table which stores L2P mapping information between a logical address assigned by the host device 11 and a physical address corresponding to an actual memory cell in the non-volatile memory device 120. Alternatively, the volatile memory device 111 may function as a firmware memory for driving the internal firmware module.

The volatile memory device 111 may include a power supply circuit 111$p$ and a plurality of sub-blocks sBLK. Under control of the refresh manager 112, the power supply circuit 111$p$ may supply a refresh voltage to the plurality of sub-blocks sBLK such that a refresh operation is performed. Each of the plurality of sub-blocks sBLK may include a plurality of memory regions. Each of the plurality of memory regions may include a plurality of memory cells. The size of the sub-block sBLK may be the minimum size capable of supporting the refresh operation of the volatile memory device 111. However, in some example embodiments the size of the sub-block sBLK may be substantially, but not exactly, the minimum size capable of supporting the refresh operation of the volatile memory device 111.

The refresh operation may refer to an operation of providing the refresh voltage to compensate for discharged charges in the DRAM-based volatile memory device 111. For example, a DRAM-based memory cell may include a transistor and a capacitor. The capacitor may be charged based on charges received through the transistor. The amount of charge of the capacitor may correspond to data stored in the memory cell. The charges charged in the capacitor may be discharged over time. The volatile memory device 111 may perform the refresh operation and may compensate for the discharged charges such that the amount of charge of the capacitor is maintained within a given range (e.g., a range in which the reliability of stored data is maintained). The refresh operation may cause power consumption.

The refresh manager 112 may manage the refresh operation of the volatile memory device 111. For example, the refresh manager 112 may support a full refresh operation. The full refresh operation may include an operation of providing refresh voltages to the plurality of sub-blocks sBLK. The refresh manager 112 may support a partial refresh operation. The partial refresh operation may include an operation of collecting valid data distributed into the plurality of sub-blocks sBLK in at least one sub-block and an operation of providing the refresh voltage to the at least one sub-block in which the valid data are collected. The refresh manager 112 may support a restore operation of restoring the valid data collected for the partial refresh operation so as to be distributed into the original sub-blocks sBLK.

The validity bitmap register 113 may store validity bitmap information. The validity bitmap information may indicate whether data stored in each of the plurality of memory regions corresponding to the plurality of sub-blocks sBLK are valid. The refresh manager 112 may update validity bitmap information stored in the validity bitmap register 113, based on a memory operation (e.g., a write operation, an overwrite operation, or a delete operation) performed in the volatile memory device 111.

The metadata table 114 may store mapping information including, but not limited to, a fixed index value and a migration index value. The fixed index value may correspond to the memory region in which data resides prior to being migrated for the partial refresh operation. The migration index value may correspond to data migrated for the partial refresh operation (i.e., data overwritten to a sub-block to be refreshed). The refresh manager 112 may store or update mapping information in the metadata table 114, based on collecting valid data distributed into the plurality of sub-blocks sBLK in at least one sub-block for the partial refresh operation.

Under control of the storage controller 110, the non-volatile memory device 120 may store data, may output the stored data, or may erase the stored data. In some example embodiments, the non-volatile memory device 120 may be, but is not limited to, a Not AND (NAND) flash memory. However, the present disclosure is not limited thereto. For the non-volatile memory device 120 may be implemented with one of various storage devices, which are able to retain data stored therein even though a power is turned off, such as a phase-change random access memory (PRAM), a magnetic random access memory (MRAM), a resistive random access memory (RRAM), and a ferroelectric random access memory (FRAM).

FIG. 2 is a block diagram illustrating a storage controller of FIG. 1, according to some example embodiments of the present disclosure. Referring to FIGS. 1 and 2, the storage controller 110 may include the volatile memory device 111, the refresh manager 112, the validity bitmap register 113, the metadata table 114, a processor 115, a host interface circuit 116, and a non-volatile memory interface circuit 117.

The volatile memory device 111 may include a DRAM. For example, the volatile memory device 111 may function as a buffer memory, an L2P mapping table, or a firmware memory. The refresh manager 112 may manage the refresh operation of the volatile memory device 111. The validity bitmap register 113 may store validity bitmap information. The metadata table 114 may store mapping information including, but not limited to, a fixed index value and a migration index value. The processor 115 may control all the operations of the storage controller 110. The processor 115 may be referred to as an "embedded processor" of the storage controller 110.

At least some of the functions of the refresh manager 112, the validity bitmap register 113, and the metadata table 114 may be implemented with a software module. For example, the processor 115 may implement at least some of the functions of the refresh manager 112, the validity bitmap register 113, and the metadata table 114 by loading instructions stored in the non-volatile memory device 120 to the volatile memory device 111 and executing the loaded instructions. Also, as in the above description, the internal firmware module may be implemented by the processor 115 and the volatile memory device 111.

The storage controller 110 may communicate with the host device 11 through the host interface circuit 116. In some example embodiments, the host interface circuit 116 may be implemented based on at least one of various interfaces such as a serial ATA (SATA) interface, a peripheral component interconnect express (PCIe) interface, a serial attached SCSI (SAS), a non-volatile memory express (NVMe) interface, and a universal flash storage (UFS) interface.

The storage controller 110 may communicate with the non-volatile memory device 120 through the non-volatile memory interface circuit 117. In some example embodiments, the non-volatile memory interface circuit 117 may be implemented based on the NAND interface.

Figure 3:
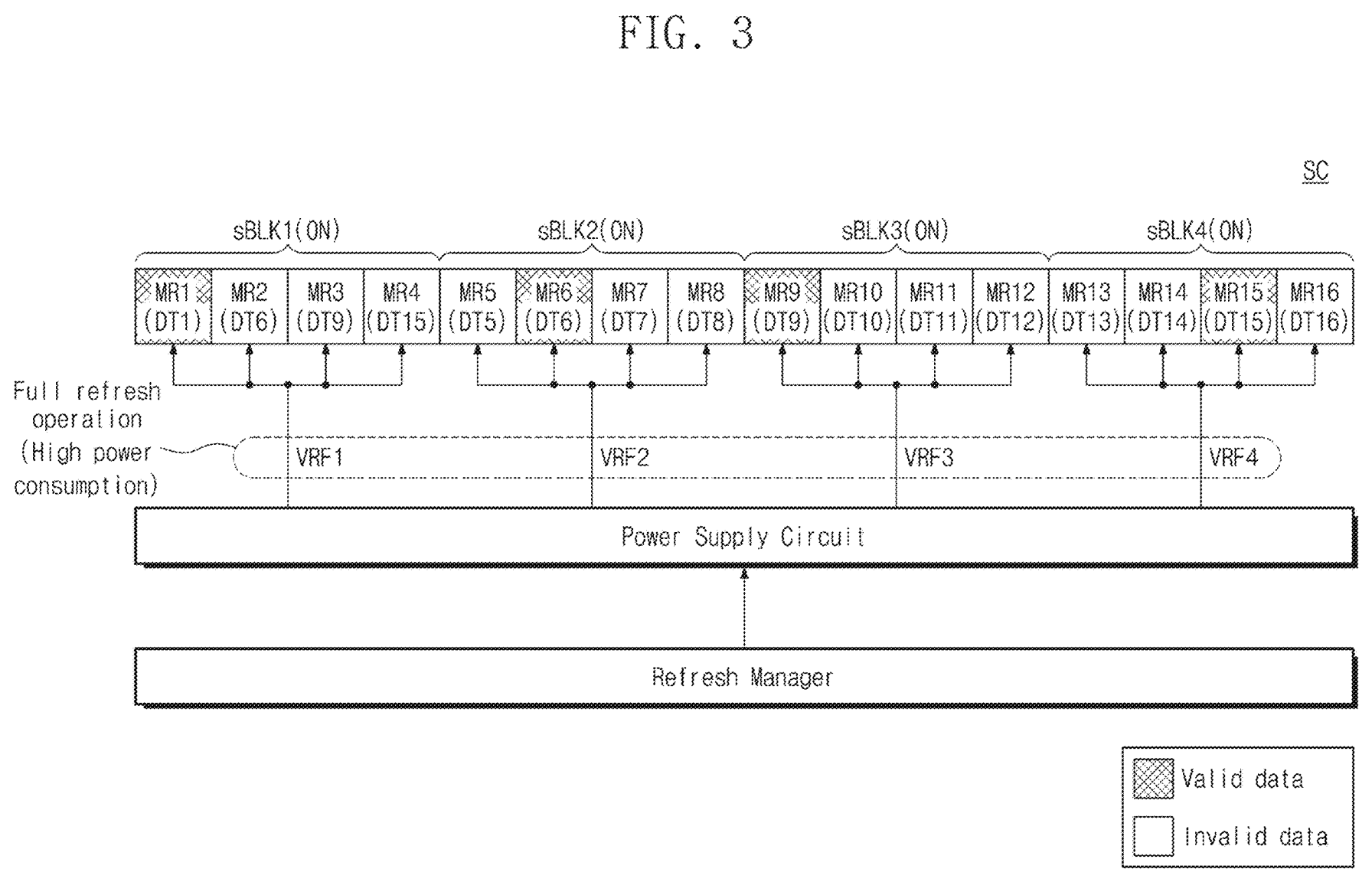

FIG. 3 is a diagram describing a full refresh operation of a conventional storage controller. Referring to FIG. 3, a conventional storage controller SC may perform the full refresh operation. For better understanding of the present disclosure, the full refresh operation is performed, but the conventional storage controller SC is not intended to limit the scope of the present disclosure. For example, according to example embodiments of the present disclosure, the storage controller 110 of FIG. 1 may support both the full refresh operation and the partial refresh operation.

The conventional storage controller SC may include a first sub-block sBLK1, a second sub-block sBLK2, a third sub-block sBLK3, a fourth sub-block sBLK4, a power supply circuit, and a refresh manager.

The first sub-block sBLK1 may include first to fourth memory regions MR1 to MR4 respectively storing first and fourth data DT1 to DT4. The first data DT1 may be valid data. The valid data may refer to data, which are validly used in a storage device, such as user data, L2P mapping information, and a firmware instruction to be stored in a non-volatile memory device. A memory region which stores valid data may be referred to as a "valid memory region".

The second, third, and fourth data DT2, DT3, and DT4 may be invalid data. The invalid data may refer to data, which are not used in a storage device, such as deleted data, a null value, and a dummy value. A memory region which stores invalid data may be referred to as an "invalid memory region".

The second sub-block sBLK2 may include fifth to eighth memory regions MR5 to MR8 respectively storing fifth to eighth data DT5 to DT8. The sixth data DT6 may be valid data. The fifth, seventh, and eighth data DT5, DT7, and DT8 may be invalid data.

The third sub-block sBLK3 may include ninth to twelfth memory regions MR9 to MR12 respectively storing ninth to twelfth data DT9 to DT12. The ninth data DT9 may be valid data. The tenth, eleventh, and twelfth data DT10, DT11, and DT12 may be invalid data.

The fourth sub-block sBLK4 may include thirteenth to sixteenth memory regions M13 to M16 respectively storing thirteenth to sixteenth data DT13 to DT16. The fifteenth data DT15 may be valid data. The thirteenth, fourteenth, and sixteenth data DT13, DT14, and DT16 may be invalid data.

As described above, because each of the first and fourth sub-blocks sBLK1 to sBLK4 includes at least one valid memory region, the refresh operation on all the first and fourth sub-blocks sBLK1 to sBLK4 may be required to maintain the reliability of valid data stored therein (e.g., to maintain charges charged in the capacitor of the memory cell).

Under control of the refresh manager, the power supply circuit may provide first and fourth refresh voltages VRF1 to VRF4 to the first and fourth sub-blocks sBLK1 to sBLK4, respectively, such that the full refresh operation corresponding to the first and fourth sub-blocks sBLK1 to sBLK4 is performed. Because there is performed the full refresh operation on all the first and fourth sub-blocks sBLK1 to sBLK4, the first and fourth sub-blocks sBLK1 to sBLK4 are marked by "ON" in association with the refresh operation.

Because the first and fourth refresh voltages VRF1 to VRF4 are provided to the first and fourth sub-blocks sBLK1 to sBLK4 during the full refresh operation, a lot of power consumption may be required.

Because the minimum size capable of supporting the refresh operation is the size of the sub-block, when the sub-block includes both a valid memory region and an invalid memory region, the refresh operation on the invalid memory region may be performed together to maintain the reliability of the valid memory region. As the refresh operation on the invalid memory region is performed, a power may be unnecessarily wasted. Accordingly, there may be required a technique for decreasing power consumption by efficiently performing the refresh operation on valid data.

Figure 4:
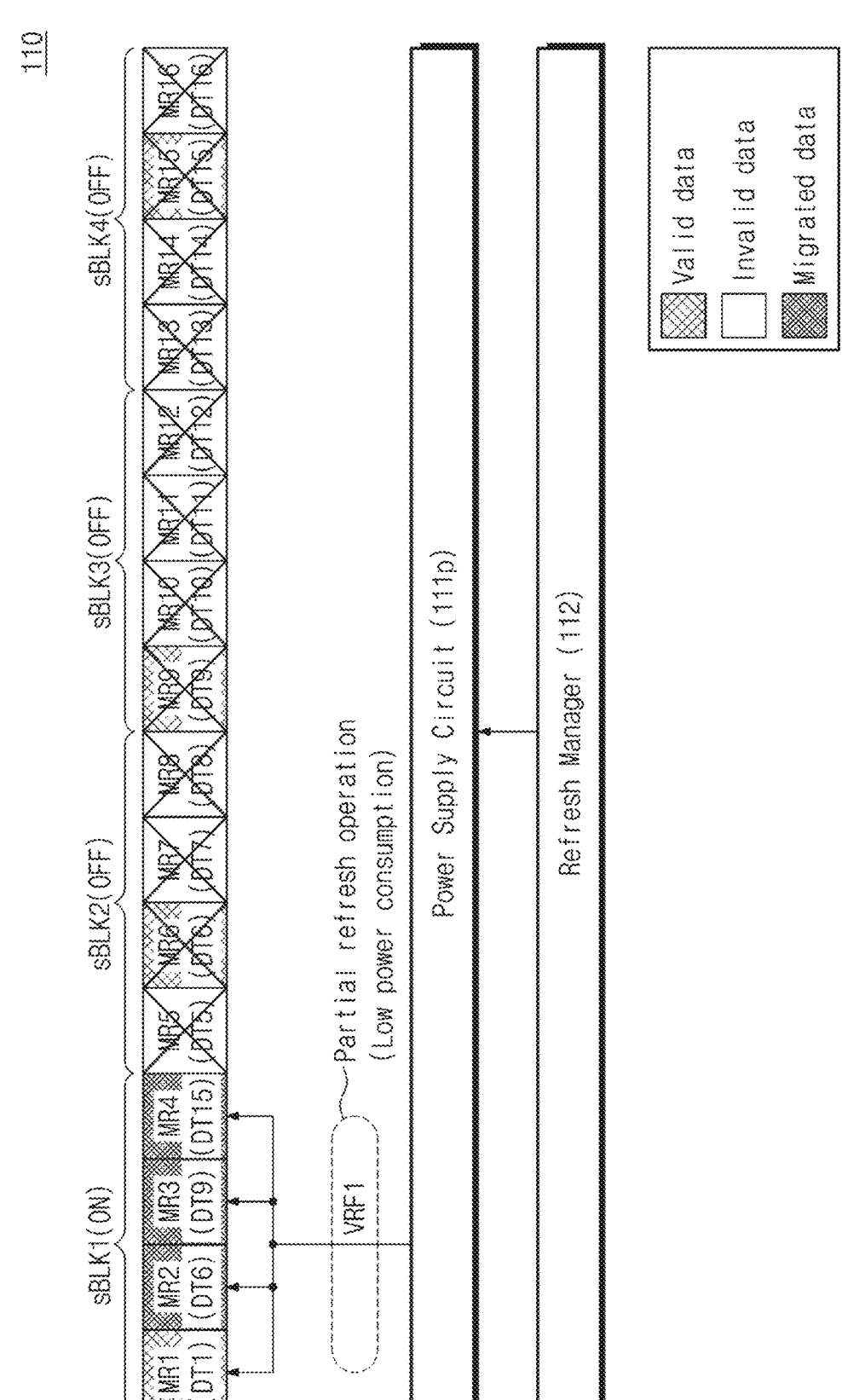
FIG. 4 is a diagram describing a partial refresh operation according to some example embodiments of the present disclosure.

FIG. 4 is a diagram describing a partial refresh operation according to some example embodiments of the present disclosure. Referring to FIG. 4, the storage controller 110 may perform the partial refresh operation. The storage controller 110 may include the first sub-block sBLK1, the second sub-block sBLK2, the third sub-block sBLK3, the fourth sub-block sBLK4, the power supply circuit 111p, and the refresh manager 112.

To perform the partial refresh operation, the refresh manager 112 may perform a collection operation on valid data distributed into the first and fourth sub-blocks sBLK1 to sBLK4.

For example, before perform the collection operation, the first sub-block sBLK1 may include the first memory region MR1 storing the first data DT1 being valid, and the second, third, and fourth memory regions MR2, MR3, and MR4 storing the second, third, and fourth data DT2, DT3, and DT4 being invalid. The second sub-block sBLK2 may include the sixth memory region MR6 storing the sixth data DT6 being valid, and the fifth, seventh, and eighth memory regions MR5, MR7, and MR8 storing the fifth, seventh, and eighth data DT5, DT7, and DT8 being invalid. The third sub-block sBLK3 may include the ninth memory region MR9 storing the ninth data DT9 being valid, and the tenth, eleventh, and twelfth memory regions MR10, MR11, and MR12 storing the tenth, eleventh, and twelfth data DT10, DT11, and DT12 being invalid. The fourth sub-block sBLK4 may include the fifteenth memory region MR15 storing the fifteenth data DT15 being valid, and the thirteenth, fourteenth, and sixteenth memory regions MR13, MR14, and MR16 storing the thirteenth, fourteenth, and sixteenth data DT13, DT14, and DT16 being invalid.

The refresh manager 112 may perform the collection operation on valid data distributed into the first and fourth sub-blocks sBLK1 to sBLK4, based on validity bitmap information stored in the validity bitmap register 113 of FIG. 1. The collection operation may refer to an operation of overwriting valid data of an inactive sub-block to an invalid memory region of an active sub-block. The inactive sub-block may refer to a sub-block which is not provided with the refresh voltage during the partial refresh operation. The activate sub-block may refer to a sub-block which is provided with the refresh voltage during the partial refresh operation.

For example, during the partial refresh operation, the refresh manager 112 may determine the second to fourth sub-blocks sBLK2 to sBLK4 as inactive sub-blocks and may determine the first sub-block sBLK1 as an active sub-block. The collection operation may include an operation of overwriting the sixth data DT6 being valid to the second memory region MR2, an operation of overwriting the ninth data DT9 being valid to the third memory region MR3, and an operation of overwriting the fifteenth data DT15 being valid to the fourth memory region MR4. The overwritten data DT6, DT9, and DT15 may be referred to as "migrated data".

After the collection operation is performed, all the valid data of the first and fourth sub-blocks sBLK1 to sBLK4 may be collected (i.e., stored) in the first sub-block sBLK1 being an active sub-block. For example, the first and fourth memory regions MR1 to MR4 of the first sub-block sBLK1 may respectively store the first data DT1 being valid, the sixth data DT6 being valid, the ninth data DT9 being valid, and the fifteenth data DT15 being valid.

After the collection operation is performed, because the valid data DT6, DT9, and DT15 of the second to fourth sub-blocks sBLK2 to sBLK4 being inactive sub-blocks are copied (i.e., migrated) to the first sub-block sBLK1 being an active sub-block, the refresh operation on the second to fourth sub-blocks sBLK2 to sBLK4 may be unnecessary. Because the first sub-block sBLK1 includes all the valid data DT1, DT6, DT9, and DT15, even though the refresh operation on the first sub-block sBLK1 is only performed, the reliability of all the valid data DT1, DT6, DT9, and DT15 may be maintained.

Under control of the refresh manager 112, the power supply circuit 111p may provide the first refresh voltage VRF1 to the first sub-block sBLK1 such that the partial refresh operation corresponding to the first sub-block sBLK1 is performed. Because there is performed the refresh operation associated with only the first sub-block sBLK1 among the first and fourth sub-blocks sBLK1 to sBLK4, the first sub-block sBLK1 is marked by "ON" in association with the refresh operation, and the second to fourth sub-blocks sBLK2 to sBLK4 are marked by "OFF" in association with the refresh operation.

Because the first refresh voltage VRF1 is provided only to the first sub-block sBLK1 among the first and fourth sub-blocks sBLK1 to sBLK4 during the partial refresh operation, power consumption may be reduced. For example, because refresh voltages are not provided to the second to fourth sub-blocks sBLK2 to sBLK4 being inactive sub-blocks, the power consumption of the partial refresh operation may be smaller than the power consumption of the full refresh operation.

As described above, according to example embodiments of the present disclosure, the storage controller 110 may reduce power consumption in the refresh operation, by collecting the valid data DT1, DT6, DT9, and DT15 distributed among the plural sub-blocks sBLK1 to sBLK4 in the first sub-block sBLK1 being an active sub-block and performing the partial refresh operation on only the first sub-block sBLK1 where the valid data DT1, DT6, DT9, and DT15 are collected.

For better understanding of the present disclosure, the description is given as each of the four sub-blocks sBLK1 to sBLK4 includes four memory regions. However, the number of sub-blocks associated with the partial refresh operation may be more than or less than "4", and the number of memory regions included in one sub-block may be more than or less than "4". Also, the description is given as the number of active sub-blocks where valid data are to be collected is "1", but valid data may be distributed and collected in two or more active sub-blocks.

Figure 5:
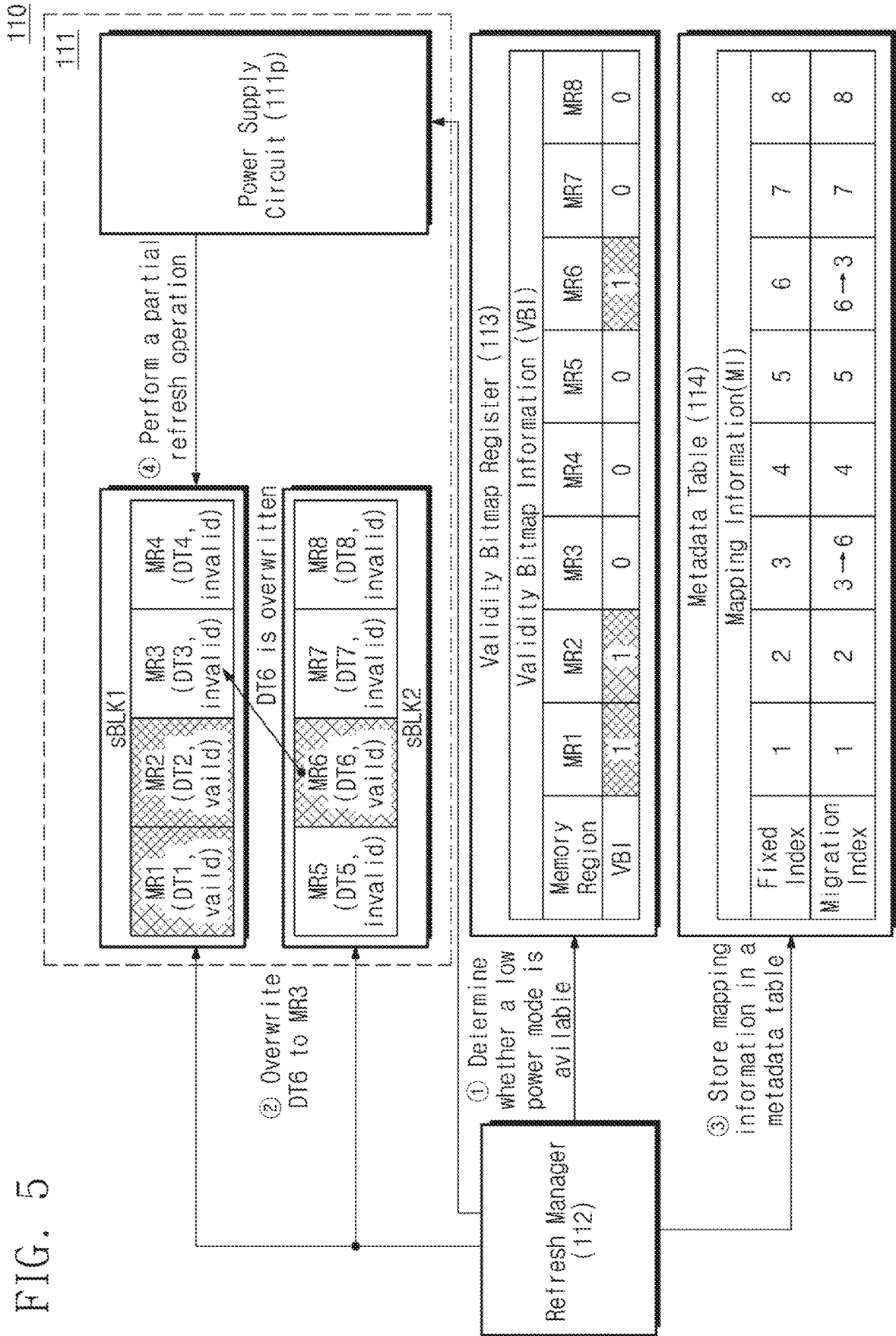
FIG. 5 is a diagram describing a collection operation of a storage controller according to some example embodiments of the present disclosure.

FIG. 5 is a diagram describing a collection operation of a storage controller according to some example embodiments of the present disclosure. Referring to FIG. 5, the storage controller 110 may include the volatile memory device 111, the refresh manager 112, the validity bitmap register 113, and the metadata table 114.

The volatile memory device 111 may include the power supply circuit 111p, the first sub-block sBLK1, and the second sub-block sBLK2. Under control of the refresh manager 112, the power supply circuit 111p may supply the refresh voltage to the first sub-block sBLK1. The size of each of the first and second sub-blocks sBLK1 and sBLK2 may be the minimum size capable of supporting the refresh operation of the volatile memory device 111.

The first sub-block sBLK1 may include the first to fourth memory regions MR1 to MR4 respectively storing the first and fourth data DT1 to DT4. The first and second data DT1 and DT2 may be valid data. The third and fourth data DT3 and DT4 may be invalid data.

The second sub-block sBLK2 may include the fifth to eighth memory regions MR5 to MR8 respectively storing the fifth to eighth data DT5 to DT8. The sixth data DT6 may be valid data. The fifth, seventh, and eighth data DT5, DT7, and DT8 may be invalid data.

The refresh manager 112 may communicate with the volatile memory device 111, the validity bitmap register 113, and the metadata table 114. The refresh manager 112 may collect distributed valid data in an active sub-block where the partial refresh operation is to be performed and may perform the partial refresh operation corresponding to the active sub-block where the valid data are collected.

The validity bitmap register 113 may store validity bitmap information VBI. The refresh manager 112 may update the validity bitmap information VBI, based on the memory operation (e.g., a write operation, an overwrite operation, or a delete operation) performed in the volatile memory device 111. The validity bitmap information VBI may indicate whether the first to eighth data DT1 to DT8 respectively stored in the first to eighth memory regions MR1 to MR8 of the volatile memory device 111 are valid or invalid, in a type of a bit string.

When a memory region corresponding to each of bits constituting the bit string stores valid data, the bit corresponding to the memory region may store a first logical value (e.g., "1"); when a memory region corresponding to each of bits constituting the bit string stores invalid data, the bit corresponding to the memory region may store a second logical value (e.g., "0"). For example, the validity bitmap information VBI may include a bit string of "11000100".

The metadata table 114 may store mapping information MI including a fixed index value and a migration index value. The fixed index value may be uniquely assigned to a memory region. The migration index value may be used to identify data migrated by the collection operation. Before the collection operation is performed, the fixed index value and the migration index value mapped by the mapping information MI may be identical to each other. After the collection operation is performed, the mapping information MI may map the fixed index value corresponding to the memory region and the migration index value corresponding to data migrated (or overwritten) by the collection operation.

Below, the collection operation of the storage controller 110 of the present disclosure will be described in detail.

In a first operation ①, the refresh manager 112 may determine whether a low-power mode is available, based on the validity bitmap information VBI stored in the validity bitmap register 113. The low-power mode may support the partial refresh operation.

For example, the validity bitmap information VBI may indicate that the first and second sub-blocks sBLK1 and sBLK2 store three valid data DT1, DT2, and DT6. The refresh manager 112 may select the first sub-block sBLK1 among the first and second sub-blocks sBLK1 and sBLK2 as an active sub-block. Because the size of the selected active sub-block is equal to or larger than the size of the three valid data DT1, DT2, and DT6, the refresh manager 112 may determine that the low-power mode is available.

In a second operation ②, the refresh manager 112 may overwrite the sixth data DT6 stored in the sixth memory region MR6 of the second sub-block sBLK2 to the third memory region MR3 of the first sub-block sBLK1 based on the validity bitmap information VBI. In other words, the refresh manager 112 may collect valid data in an active sub-block by overwriting valid data of an inactive sub-block to an invalid memory region of the active sub-block.

In some example embodiments, the refresh manager 112 may swap the sixth data DT6 of the sixth memory region MR6 of the second sub-block sBLK2 with the third data DT3 of the third memory region MR3 of the first sub-block sBLK1 based on the validity bitmap information VBI. For example, when the volatile memory device 111 supports a swap function of swapping two data stored at different physical locations, the refresh manager 112 may swap valid data of an inactive sub-block and invalid data of an active sub-block for the collection operation.

In a third operation ③, the refresh manager 112 may store the mapping information MI of the fixed index value of "3" corresponding to the third memory region MR3 and the migration index value of "6" corresponding to the overwritten sixth data DT6 in the metadata table 114. Also, to uniquely identify the location of the overwritten sixth data DT6, the refresh manager 112 may further store the mapping information MI of the fixed index value of "6" corresponding to the sixth memory region MR6 and the migration index value of "3" corresponding to the third data DT3 deleted by the overwriting in the metadata table 114.

Because the third data DT3 are invalid data, the reliability of the third data DT3 may not be important. Regardless of whether the third data DT3 are actually stored in the sixth memory region MR6, the refresh manager 112 may store the mapping information MI of the fixed index value of "6" corresponding to the sixth memory region MR6 and the migration index value of "3" corresponding to the third data DT3 in the metadata table 114.

In a fourth operation ④, the refresh manager 112 may perform the partial refresh operation corresponding to the first sub-block sBLK1. For example, the refresh manager 112 may control the power supply circuit 111p. Under control of the refresh manager 112, the power supply circuit 111p may supply the refresh voltage to the first sub-block sBLK1. In this case, the power supply circuit 111p may not provide the refresh voltage to the second sub-block sBLK2. The power consumption of the storage controller 110 may be reduced by performing the partial refresh operation on only an active sub-block, in which valid data are collected, instead of performing the full refresh operation on plural sub-blocks where valid data are distributed.

Figure 6:
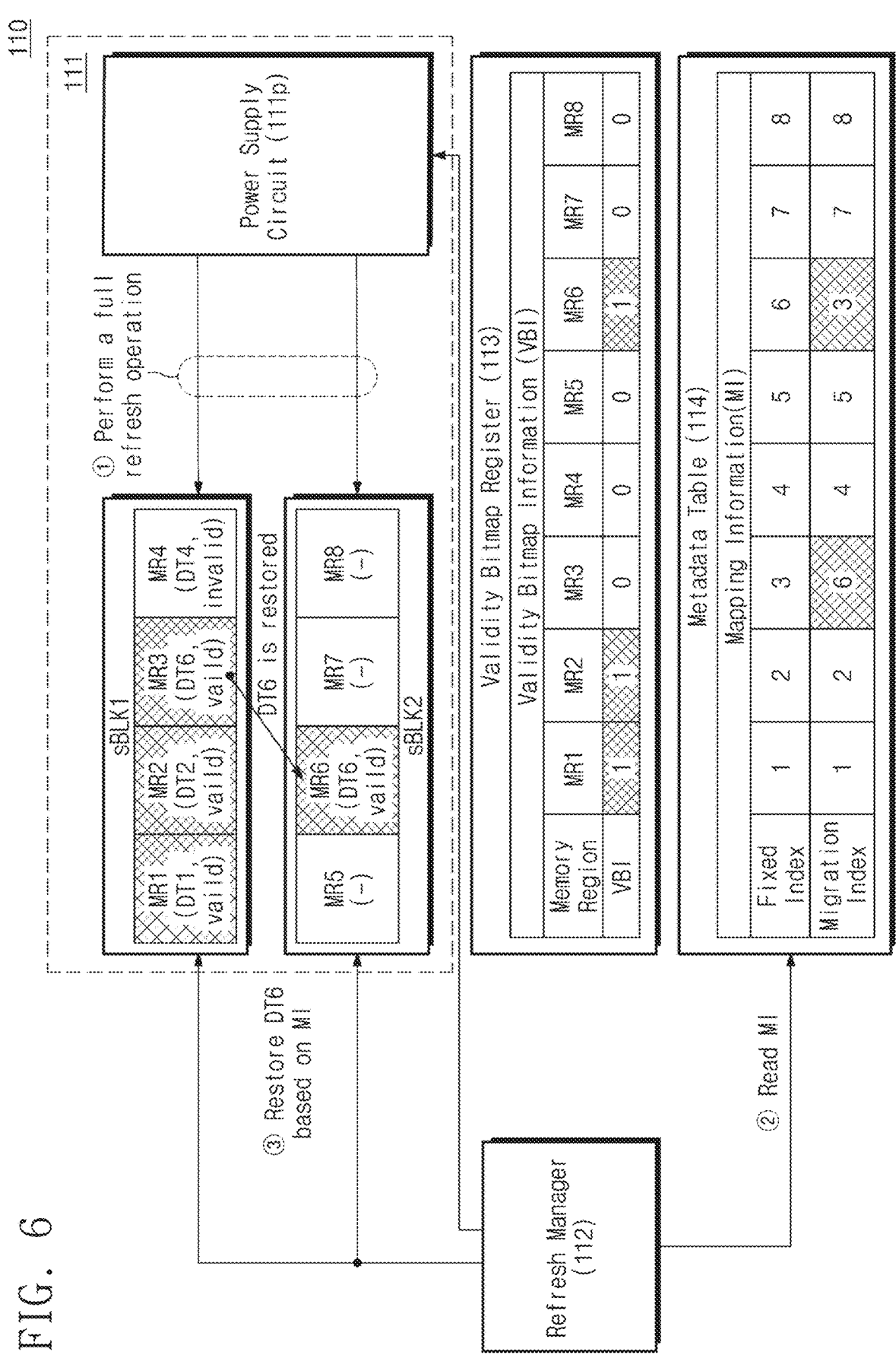
FIG. 6 is a diagram describing a restore operation of a storage system according to some example embodiments of the present disclosure.

FIG. 6 is a diagram describing a restore operation of a storage system according to some example embodiments of the present disclosure. Referring to FIG. 6, the storage controller 110 may include the volatile memory device 111, the refresh manager 112, the validity bitmap register 113, and the metadata table 114.

The volatile memory device 111 may include the power supply circuit 111p, the first sub-block sBLK1, and the second sub-block sBLK2. Under control of the refresh manager 112, the power supply circuit 111p may supply the refresh voltage to the first and second sub-blocks sBLK1 and sBLK2.

The first sub-block sBLK1 may include the first and fourth memory regions MR1 to MR4 respectively storing the first, second, sixth, and fourth data DT1, DT2, DT6, and DT4. The first, second, and sixth, data DT1, DT2, and DT6 may be valid data. The sixth data DT6 may be migrated from the second sub-block sBLK2 to the first sub-block sBLK1 by a previous collection operation. The fourth data DT4 may be invalid data.

The second sub-block sBLK2 may include the fifth to eighth memory regions MR5 to MR8. During a previous partial refresh operation, the second sub-block sBLK2 may not be provided with the refresh voltage. Each of the fifth to eighth memory regions MR5 to MR8 may store data (i.e., invalid data) whose reliability is damaged as the capacitor is discharged.

The refresh manager 112 may communicate with the volatile memory device 111, the validity bitmap register 113, and the metadata table 114. After the partial refresh operation is performed, the refresh manager 112 may perform the full refresh operation and the restore operation in response to receiving a low-power mode exit command. The restore operation may refer to an operation of restoring valid data collected for the partial refresh operation so as to be distributed into original sub-blocks.

The validity bitmap register 113 may store the validity bitmap information VBI. The validity bitmap information VBI may be independent for the collection operation and the restore operation. For example, the validity bitmap information VBI may not change even if a collection operation or recovery operation is performed. Before the collection operation is performed and after the restore operation is performed, the validity bitmap information VBI may indicate whether the data DT1 to DT8 respectively stored in the memory regions MR1 to MR8 are valid or invalid, in a type of a bit string. For example, the validity bitmap information VBI may include a bit string of "11000100".

The metadata table 114 may store the mapping information MI of the fixed index value and the migration index value. The mapping information MI may indicate whether valid data are migrated by the collection operation and whether valid data are migrated from any location. After the restore operation is completed, the metadata table 114 may be initialized by the refresh manager 112. In the initialized metadata table 114, the mapping information MI may map the fixed index value and the migration index value which are identical to each other.

Below, the restore operation of the storage controller 110 of the present disclosure will be described in detail.

In a first operation ①, the refresh manager 112 may perform the full refresh operation corresponding to the first and second sub-blocks sBLK1 and sBLK2. For example, the storage controller 110 may perform the partial refresh operation in the low-power mode. The refresh manager 112 may receive a low-power mode exit command during the low-power mode. The refresh manager 112 may control the power supply circuit 111p in response to the low-power mode exit command. Under control of the refresh manager 112, the power supply circuit 111p may supply the refresh voltages to the first and second sub-blocks sBLK1 and sBLK2.

In a second operation ②, the refresh manager 112 may read the mapping information MI stored in the metadata table 114. The mapping information MI may map the fixed index value of "3" corresponding to the third memory region MR3 and the migration index value of "6" corresponding to the overwritten sixth data DT6.

In a third operation ③, the refresh manager 112 may restore the sixth data DT6 based on the mapping information MI. For example, by referring to the mapping information MI, the refresh manager 112 may identify the fixed index value of "3" different from the migration index value of "6" from among the fixed index values of "1", "2", "3", and "4" corresponding to the first to fourth memory regions MR1 to MR4 of the first sub-block sBLK1 being an active sub-block. By referring to the migration index value of "6" mapped to the identified fixed index value of "3", the refresh manager 112 may copy the sixth data DT6 being valid to the sixth memory region MR6 corresponding to the fixed index value of "6" being identified to the migration index value of "6". The copy may be performed in an overwrite manner.

After the sixth data DT6 of the third memory region MR3 are copied to the sixth memory region MR6, the third memory region MR3 may maintain the sixth data DT6 as invalid data. The refresh manager 112 may restore all the migrated valid data of the active sub-block and may then initialize the metadata table 114.

Figure 7:
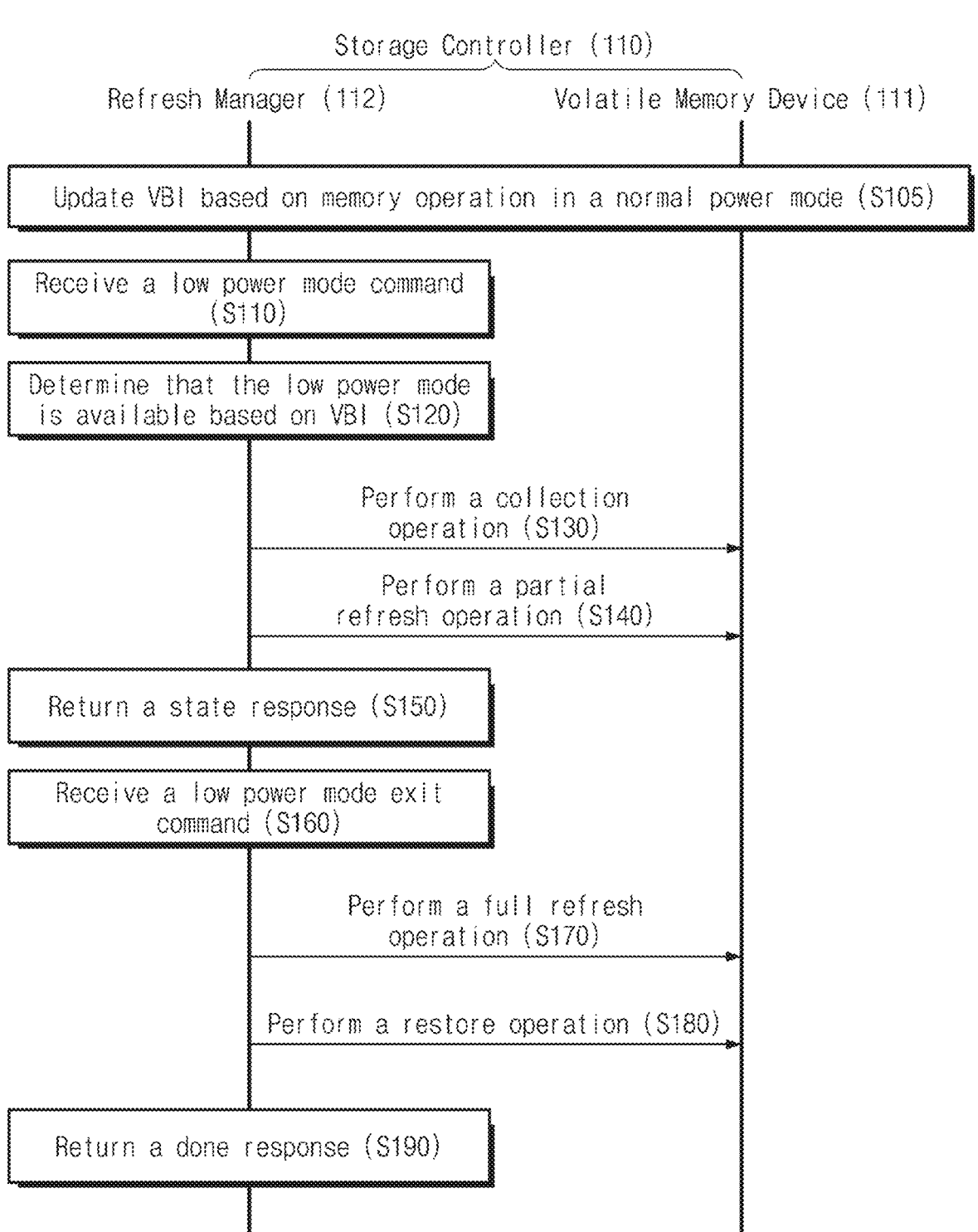
FIG. 7 is a flowchart describing a method of operating a storage controller according to some example embodiments of present the plurality disclosure.

FIG. 7 is a flowchart describing a method of operating a storage controller according to some example embodiments of present the plurality disclosure. Referring to FIG. 7, the storage controller 110 may include the refresh manager 112 and the volatile memory device 111.

In operation S105, the storage controller 110 may operate in a normal power node. The normal power node may support the full refresh operation on sub-blocks of the volatile memory device 111. The storage controller 110 may update the validity bitmap information VBI based on the memory operation in the normal power node. The validity bitmap information VBI may indicate validity or invalidity of data stored in each of memory regions corresponding to the sub-blocks of the volatile memory device 111.

In operation S110, the refresh manager 112 may receive a low-power mode command. The low-power mode may support the partial refresh operation. For example, the refresh manager 112 may receive the low-power mode command from the external host device or the internal firmware module.

In operation S120, the refresh manager 112 may determine whether the low-power mode is available, based on the validity bitmap information VBI. For example, the refresh manager 112 may identify the number of valid data based on the validity bitmap information VBI; when the size of at least one selected active sub-block is equal to or larger than the product of the number of valid data and the size of the memory region, the refresh manager 112 may determine that the low-power mode is available.

In operation S130, the refresh manager 112 may perform the collection operation. The collection operation may refer to an operation of overwriting valid data of an inactive sub-block to an invalid memory region of an active sub-block.

In operation S140, the refresh manager 112 may receive the partial refresh operation. The partial refresh operation may refer to an operation of providing the refresh voltage only to an active sub-block among the sub-blocks of the volatile memory device 111. This may be described as the storage controller 110 operates in the low-power mode.

In operation S150, the refresh manager 112 may return a state response indicating whether the low-power mode is applied. The state response may be returned to a component which provides the low-power mode command in operation S110. For example, the refresh manager 112 may return, to the external host device or the internal firmware module, a success response indicating that the low-power mode is applied or a failure response indicating that the low-power mode is not applied.

In operation S160, the refresh manager 112 may receive the low-power mode exit command. When the low-power mode ends, the storage controller 110 may operate in the normal power node. For example, the refresh manager 112 may receive the low-power mode exit command from the external host device or the internal firmware module.

In operation S170, the refresh manager 112 may perform the full refresh operation. The full refresh operation may refer to an operation of providing the refresh voltages to the sub-blocks of the volatile memory device 111.

In operation S180, the refresh manager 112 may perform the restore operation. The restore operation may refer to an operation of copying valid data migrated from an inactive sub-block to an active sub-block by the collection operation to a memory region of the original inactive sub-block. The description may be given as after the restore operation is completed, the storage controller 110 operates in the normal power node.

In operation S190, the refresh manager 112 may return a done response. The done response may be returned to a component which provides the low-power mode exit command in operation S160. For example, the refresh manager 112 may return, to the external host device or the internal firmware module, the done response indicating that the low-power mode ends and the normal power node is applied.

Figure 8:
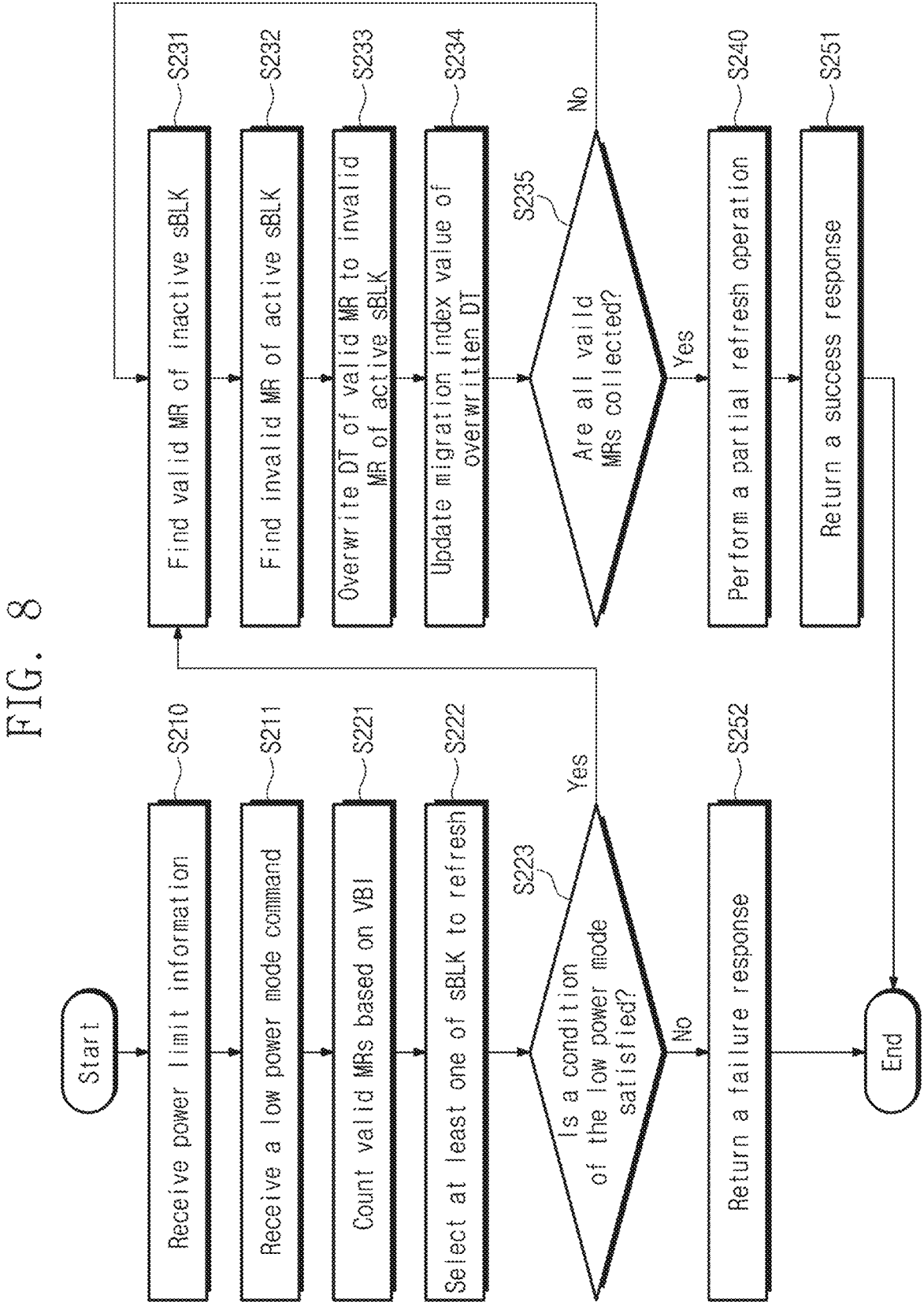
FIG. 8 is a flowchart describing some operations of the flowchart of FIG. 7, according to some example embodiments of the present disclosure.

FIG. 8 is a flowchart describing some operations of the flowchart of FIG. 7, according to some example embodiments of the present disclosure. Referring to FIGS. 7 and 8, the storage controller 110 may include the refresh manager 112 and the volatile memory device 111. Operation S210 and operation S211 may correspond to operation S110. Operation S221, Operation S222, and operation S223 may correspond to operation S120. Operation S231, operation S232, operation S233, operation S234, and operation S235 may correspond to operation S130. Operation S240 may correspond to operation S140. Operation S251 and operation S252 may correspond to operation S150.

In operation S210, the refresh manager 112 may receive power limit information from the external host device or the internal firmware module. The power limit information may be used to determine the availability of the low-power mode. For example, the power limit information may include a level of a power supplied from the external host device, the number of sub-blocks in which the collection operation will be performed, the size of a sub-block, the number of memory regions mapped to a sub-block, the size of a memory region, the number of active sub-blocks, the number of inactive sub-blocks, a limit time of the entering of the low-power mode, a limit time of the exit of the low-power mode, a limit time of a success response, a limit time of a failure response, etc.

In operation S211, the refresh manager 112 may receive the low-power mode command from the external host device or the internal firmware module. The low-power mode may support the partial refresh operation.

In some example embodiments, the order of operation S210 and operation S211 may be modified. For example, operation S210 may be performed prior to operation S211, operation S211 may be performed prior to operation S210, or operation S210 and operation S211 may be performed in parallel.

In operation S221, the refresh manager 112 may count the valid memory regions MR of the volatile memory device 111 based on the validity bitmap information VBI. For example, the refresh manager 112 may count at least one valid memory region MR among a plurality memory regions MR corresponding to the validity bitmap information VBI.

In operation S222, the refresh manager 112 may select at least one sub-block sBLK to be refreshed in the volatile memory device 111. In detail, the refresh manager 112 may select at least one sub-block sBLK, to which the partial refresh operation is to be applied, from among the plurality of sub-blocks sBLK corresponding to the validity bitmap information VBI. The at least one sub-block sBLK thus selected may be referred to as an "active sub-block". Unselected sub-blocks sBLK, that is, the remaining sub-blocks sBLK may be referred to as "inactive sub-blocks".

In operation S223, the refresh manager 112 may determine whether a condition of the low-power mode is satisfied, based on the counted number of valid memory regions MR and the at least one selected sub-block sBLK. The condition may be determined based on the power limit information in operation S210.

For example, when the size of the at least one selected sub-block sBLK is larger than or equal to the product of the counted number of valid memory regions MR and the size of the memory region MR, the refresh manager 112 may determine that the condition of the low-power mode is satisfied.

When it is determined that the condition of the low-power mode is satisfied, the refresh manager 112 may perform operation S231.

In operation S231, the refresh manager 112 may find the valid memory region MR of the inactive sub-block sBLK of the volatile memory device 111.

In operation S232, the refresh manager 112 may find the invalid memory region MR of the active sub-block sBLK of the volatile memory device 111.

In operation S233, the refresh manager 112 may overwrite the valid data DT of the valid memory region MR of the inactive sub-block sBLK to the invalid memory region MR of the active sub-block sBLK.

In operation S234, the refresh manager 112 may update the migration index value of the overwritten data DT.

Operation S231 to operation S234 may be collectively referred to as a "sub-collection operation". The sub-collection operation may refer to an operation of migrating one valid data DT of the inactive sub-block sBLK.

In operation S235, the refresh manager 112 may determine whether the valid data DT of all the valid memory regions MR corresponding to the validity bitmap information VBI are collected in the active sub-block sBLK.

When the valid data DT which are not collected (or migrated) are present in the valid memory region MR of the inactive sub-block sBLK, the refresh manager 112 may again perform operation S231 to operation S234 in association with any other valid memory region MR not collected (or whose valid data are not collected). When all the valid memory regions MR (or valid data of all the valid memory regions MR) are collected to the active sub-block sBLK, the refresh manager 112 may perform operation S240.

Operation S231 to operation S235 may be collectively referred to as a "collection operation". The collection operation may refer to an operation of migrating all the valid data DT of the inactive sub-block sBLK to the active sub-block sBLK.

In operation S240, the refresh manager 112 may perform the partial refresh operation corresponding to the active sub-block sBLK of the volatile memory device 111.

In operation S251, the refresh manager 112 may return the success response, which indicates that the low-power mode is applied, to the external host device or the internal firmware module.

Returning to operation S223, when it is determined that the condition of the low-power mode is not satisfied, the refresh manager 112 may perform operation S252.

In operation S252, the refresh manager 112 may receive the failure response, which indicates that the low-power mode is not applied, to the external host device or the internal firmware module.

Figure 9:
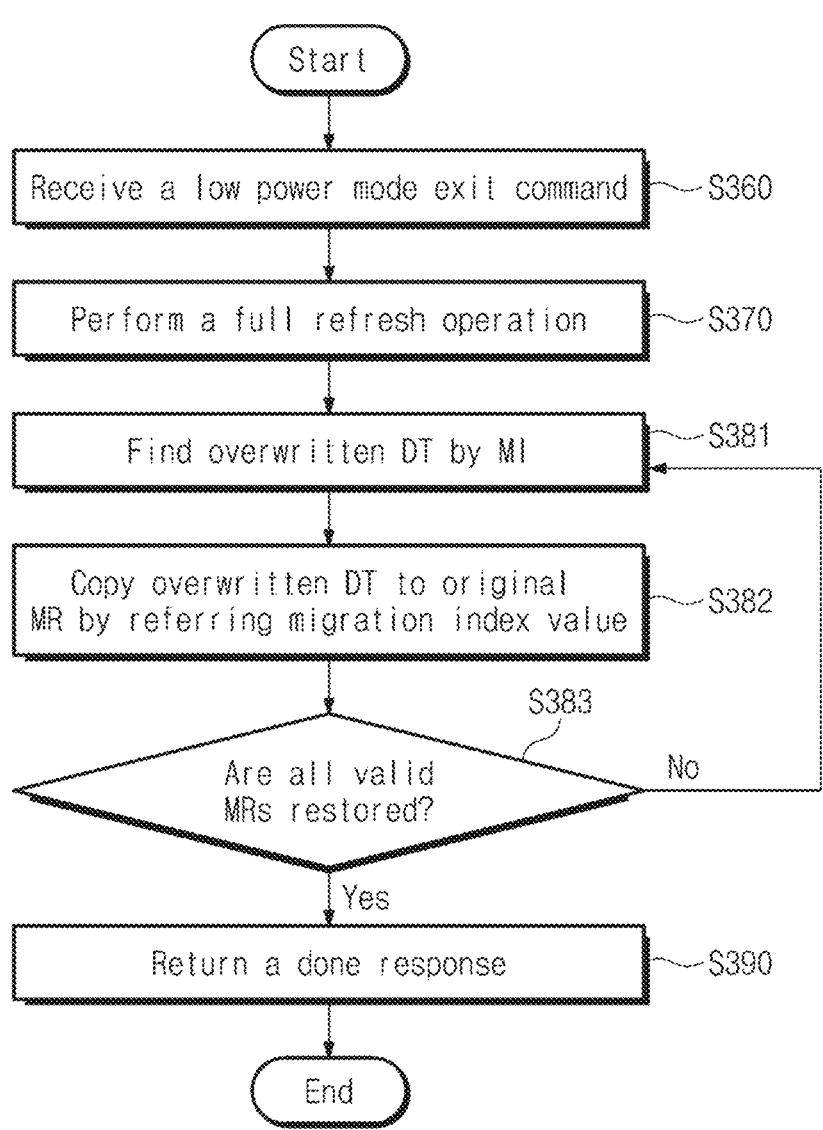
FIG. 9 is a flowchart describing some operations of FIG. 7, according to some example embodiments of the present disclosure.

FIG. 9 is a flowchart describing some operations of FIG. 7, according to some example embodiments of the present disclosure. Referring to FIGS. 7 and 9, the storage controller 110 may include the refresh manager 112 and the volatile memory device 111. Operation S360 may correspond to operation S160. Operation S370 may correspond to operation S170. Operation S381, Operation S382, and operation S383 may correspond to operation S180. Operation S390 may correspond to operation S190.

In operation S360, the refresh manager 112 may receive the low-power mode exit command from the external host device or the internal firmware module. When the low-power mode ends, the storage controller 110 may operate in the normal power node. The normal power mode may support the full refresh operation.

In operation S370, the refresh manager 112 may perform the full refresh operation. The full refresh operation may refer to an operation of providing the refresh voltages to both the active sub-block sBLK and the inactive sub-block sBLK.

In operation S381, the refresh manager 112 may find the overwritten data DT by referring to the mapping information MI. For example, the refresh manager 112 may identify the mapping information MI in which the fixed index value and the migration index value do not coincide.

In operation S382, the refresh manager 112 may copy the overwritten data DT to the original memory region MR by referring to the migration index value. For example, the refresh manager 112 may copy the data DT to the memory region MR corresponding to the fixed index value identical to the migration index value.

Operation S381 and operation S382 may be collectively referred to as a "sub-restore operation". The sub-restore operation may refer to an operation of copying one data DT migrated to the active sub-block sBLK by the sub-collection operation to an original memory region before the collection operation.

In operation S383, the refresh manager 112 may determine whether all the valid memory regions MR (i.e., the memory regions MR storing the overwritten data DT) are restored, based on the mapping information MI corresponding to the memory regions MR belonging to the active sub-block sBLK.

When there is a memory region MR which is not restored, the refresh manager 112 may again perform operation S381 and operation S382 in association with any other overwritten data DT of the memory region MR not restored. When all the valid memory regions MR are restored, the refresh manager 112 may perform operation S390.

Operation S381, operation S382, and operation S383 may be collectively referred to as a "restore operation". The restore operation may refer to an operation of copying all the valid data DT migrated by the collection operation to the original memory region MR.

In operation S390, the refresh manager 112 may return the done response, which indicates that the low-power mode ends and the normal power mode is applied, to the external host device or the internal firmware module. Also, the refresh manager 112 may initialize the mapping information MI such that the migration index value coincides with the fixed index value.

Figure 10:
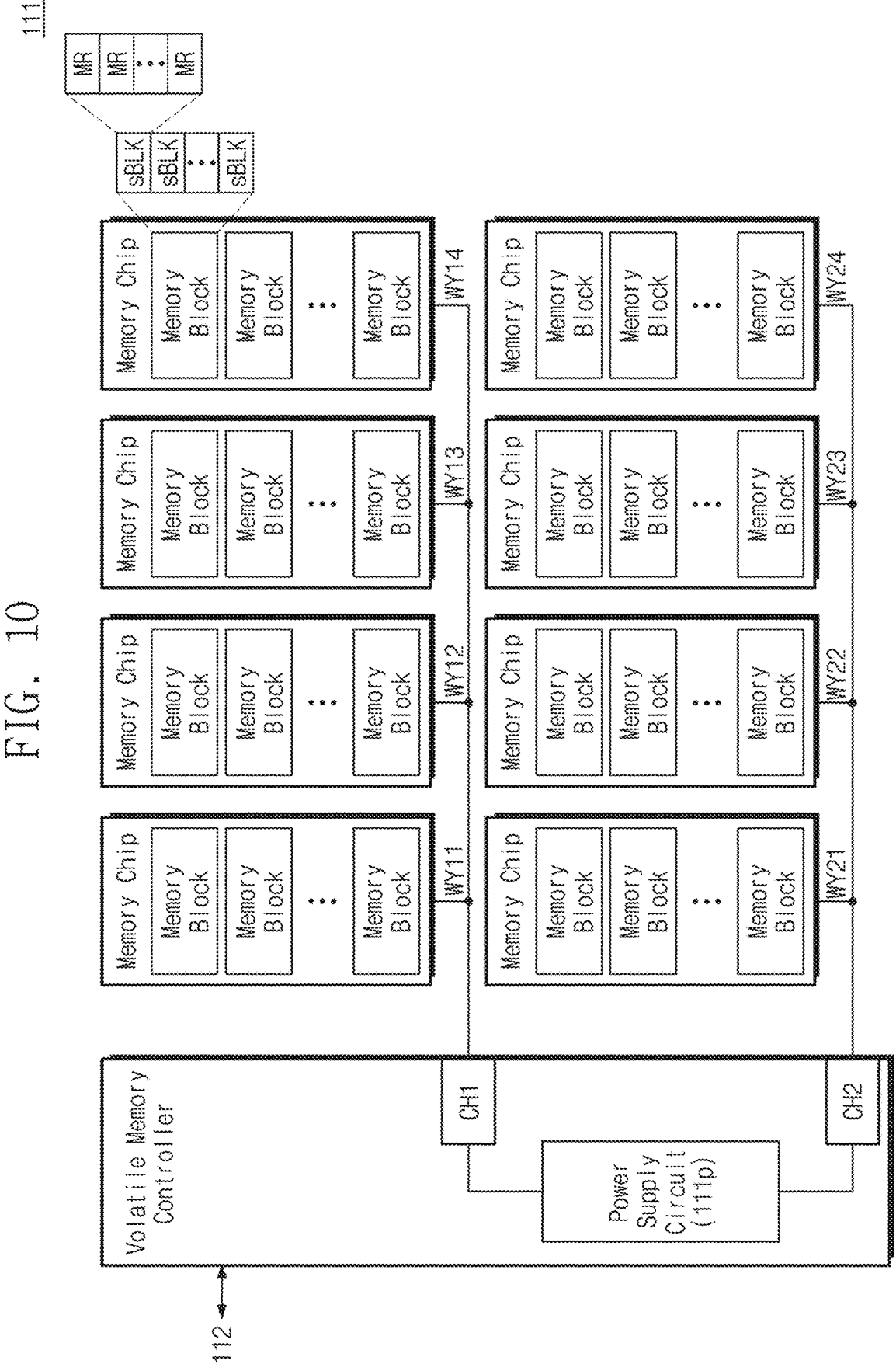
FIG. 10 is a block diagram describing a volatile memory device according to some example embodiments of the present disclosure.

FIG. 10 is a block diagram describing a volatile memory device according to some example embodiments of the present disclosure. Referring to FIG. 10, the volatile memory device 111 may communicate with the refresh manager 112.

The volatile memory device 111 may include a volatile memory controller and a plurality of memory chips. The volatile memory controller may communicate with the refresh manager 112. The volatile memory controller may store data in memory chips or may read data stored therein.

Also, the volatile memory controller may apply the refresh voltages to memory chips under control of the refresh manager 112.

The volatile memory controller may include the power supply circuit 111p, a first memory channel CH1, and a second memory channel CH2. Under control of the refresh manager 112, the power supply circuit 111p may supply the write voltage, the read voltage, or the refresh voltage to the first and second memory channels CH1 and CH2.

The first memory channel CH1 may be connected to the corresponding memory chips through memory ways WY11, WY12, WY13, and WY14. Each of the memory chips may include a plurality of memory blocks. Each of the plurality of memory blocks may include a plurality of sub-blocks sBLK. The size of the sub-block sBLK may be the smallest size capable of providing the refresh voltage through the power supply circuit 111p. Each of the plurality of sub-blocks sBLK may include a plurality of memory regions MR.

As in the above description, the second memory channel CH2 may be connected to the corresponding memory chips through memory ways WY21, WY22, WY23, and WY24. Each of the memory chips may include a plurality of memory blocks. Each of the plurality of memory blocks may include a plurality of sub-blocks sBLK. Each of the plurality of sub-blocks sBLK may include a plurality of memory regions MR.

For better understanding of the present disclosure, the description is given as the volatile memory device 111 includes two memory channels CH1 and CH2 and one memory channel is connected to four memory ways, but the present disclosure is not limited thereto. The volatile memory device 111 may be implemented to include a single memory channel or to include two or more memory channels. Also, the number of memory ways connected to one memory channel may be less than or more than "4".

Figure 11:
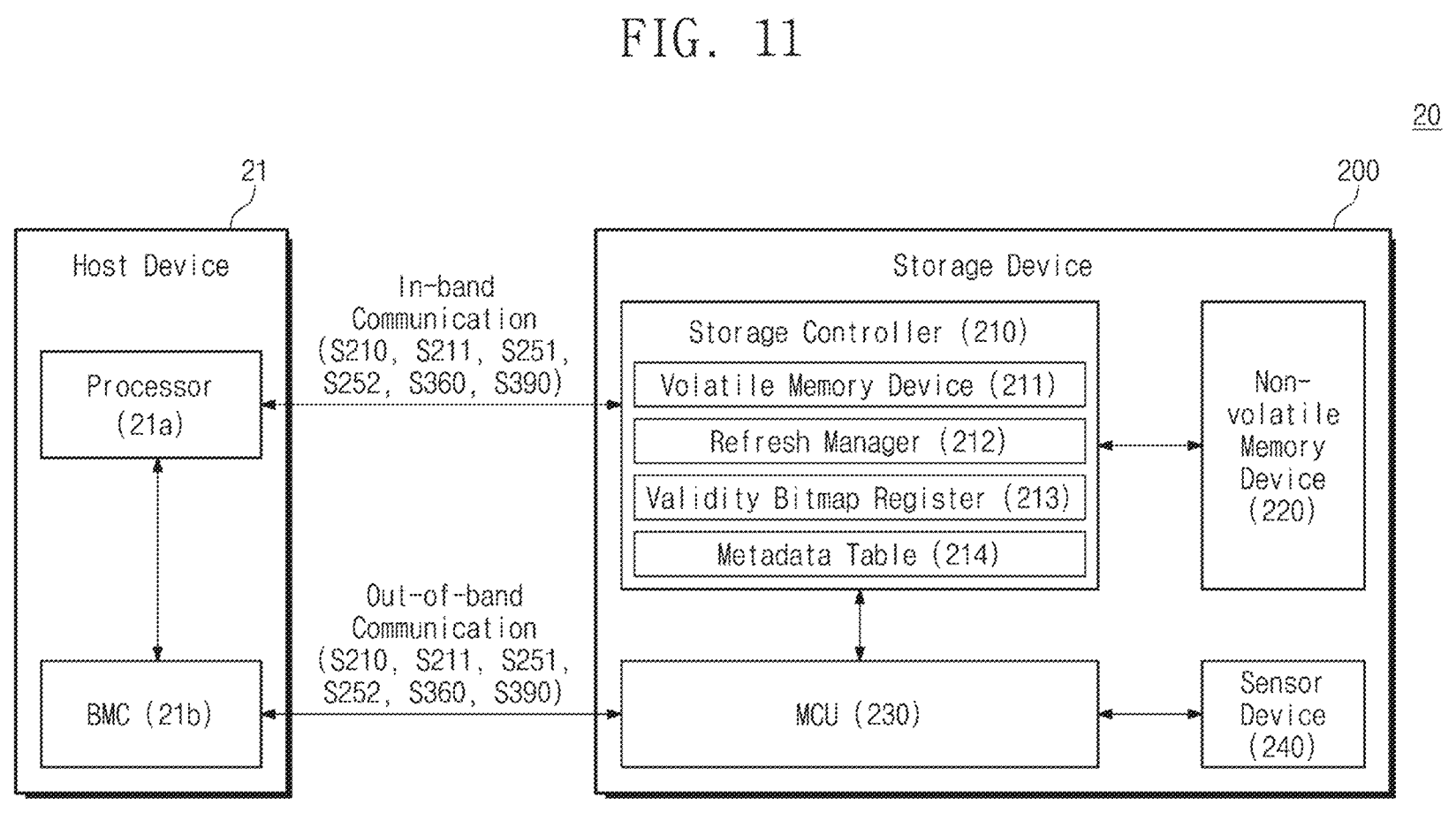

FIG. 11 is a block diagram of an electronic device according to some example embodiments of the present disclosure. Referring to FIG. 11, an electronic device 20 may support the in-band-communication and the out-of-band communication. The electronic device 20 may include a host device 21 and a storage device 200.

The host device 21 may include a processor 21a and a baseboard management controller (BMC) 21b. The processor 21a and the BMC 21b may communicate with each other.

The processor 21a may store data in the storage device 200 or may read data stored in the storage device 200. For example, the processor 21a may be implemented with a central processing unit (CPU). The BMC 21b may manage hardware information of the storage device 200.

The storage device 200 may include a storage controller 210, a non-volatile memory device 220, a micro controller unit (MCU) 230, and a sensor device 240. The storage controller 210 may include a volatile memory device 211, a refresh manager 212, a validity bitmap register 213, and a metadata table 214.

The storage controller 210 may control all the operations of the storage device 200 under control of the processor 21a. The non-volatile memory device 220 may store data under control of the storage controller 210. The MCU 230 may manage the hardware information of the storage device 200. The sensor device 240 may sense an internal physical environment (e.g., a temperature, a voltage, a current, a humidity) of the storage device 200.

The processor 21a of the host device 21 and the storage controller 210 of the storage device 200 may directly perform the in-band communication. The in-band-communication may be mainly used to transmit user data which an operating system (OS) of the host device 21 manages.

The storage controller 210 may be driven based on a main power supply voltage received from the host device 21. The storage controller 210 may perform the in-band communication with the host device 21 based on the main power supply voltage.

The BMC 21*b* of the host device 21 and the MCU 230 of the storage device 200 may directly perform the out-of-band communication. The out-of-band communication may be mainly used to transmit the hardware information of the storage device 200 or information derived therefrom.

The storage controller 210 may indirectly perform the out-of-band communication with the host device 21 through the MCU 230. The MCU 230 may be driven based on an auxiliary power supply voltage received from the host device 21. The auxiliary power supply voltage may be lower than the main power supply voltage. The auxiliary power supply voltage may be a constant voltage. The MCU 230 may perform the out-of-band communication with the host device 21 based on the auxiliary power supply voltage.

The storage controller 210 may selectively utilize the in-band communication and the out-of-band communication. For example, the storage controller 210 may select one of the in-band communication and the out-of-band communication as a communication method. The storage controller 210 may transmit or receive at least one of the power limit information (S210 of FIG. 8), the power limit information command (S211 of FIG. 8), the success response (S251 of FIG. 8), the failure response (S252 of FIG. 8), the low-power mode exit command (S360 of FIG. 9), and the done response (S390 of FIG. 9), based on the selected communication method.

Figure 12:
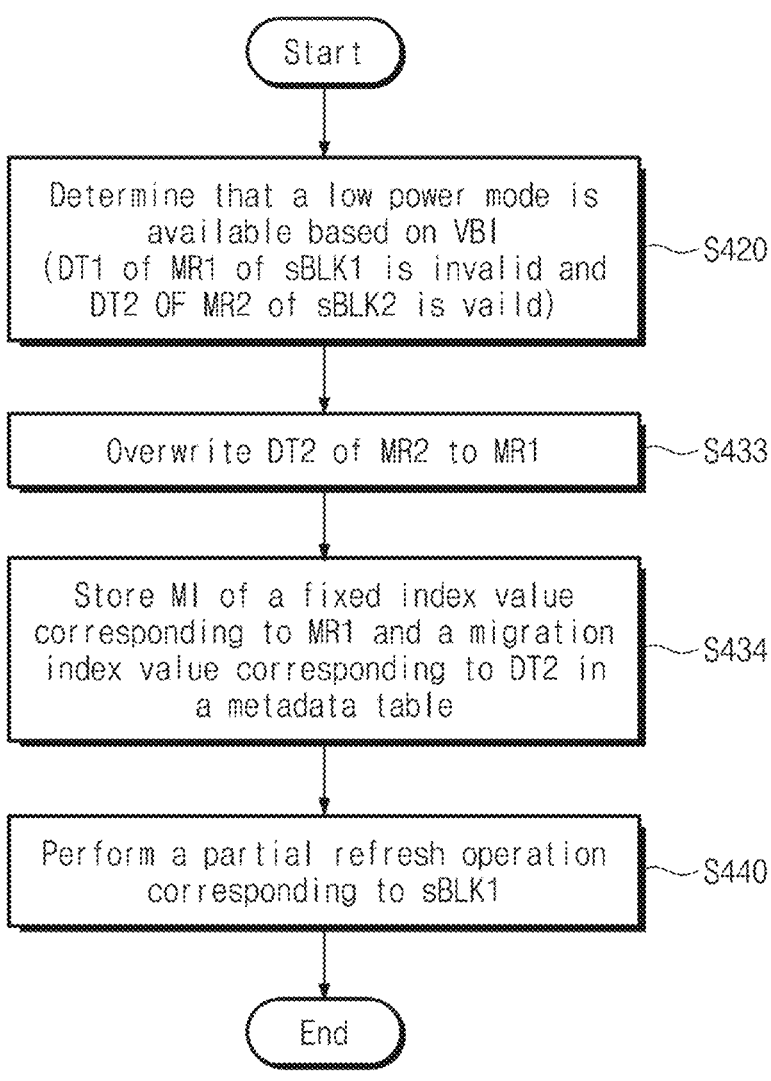
FIG. 12 is a flowchart describing a method of operating a storage controller according to some example embodiments of the present disclosure.

FIG. 12 is a flowchart describing a method of operating a storage controller according to some example embodiments of the present disclosure. Referring to FIG. 12, a storage controller may include a volatile memory device, a validity bitmap register, and a metadata table. The volatile memory device may include a DRAM. The validity bitmap register may store the validity bitmap information VBI.

In operation S420, the storage controller may determine whether the low-power mode is available, based on the validity bitmap information VBI. The volatile memory device may include the first sub-block sBLK1 and the second sub-block sBLK2. The first sub-block sBLK1 may include a first memory region MR1. The first memory region MR1 may store the first data DT1. The second sub-block sBLK2 may include a second memory region MR2.

The second memory region MR2 may store the second data DT2. The validity bitmap information VBI may indicate the invalidity of the first data DT1 and the validity of the second data DT2. The size of each of the first and second sub-blocks sBLK1 and sBLK2 may be the minimum size capable of supporting the refresh operation of the volatile memory device.

In operation S433, in response to determining that the low-power mode is available, the storage controller may overwrite the second data DT2 stored in the second memory region MR2 to the first memory region MR1 based on the validity bitmap information VBI. Afterwards, the first memory region MR1 may store the overwritten second data DT2.

In operation S434, the storage controller may store, in the metadata table, the mapping information MI of the fixed index value corresponding to the first memory region MR1 and the migration index value corresponding to the overwritten second data DT2.

In operation S440, the storage controller may perform the partial refresh operation corresponding to the first sub-block sBLK1. In this case, the storage controller may perform the refresh operation on only the first sub-block sBLK1 among the first and second sub-blocks sBLK1 and sBLK2.

According to an example embodiment of the present disclosure, a storage controller performing a partial refresh operation, a storage device including the same, and a method of operating the same are provided.

Also, a storage controller which reduces power consumption by collecting valid data distributed into plural sub-blocks to an active sub-block and performing the refresh operation on only the active sub-block where the valid data are collected, a storage device including the same, and a method of operating the same are provided.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It will be understood that when elements, functions, etc. are referenced as being the same, they may also be substantially the same or similar even if the terminology substantially and similar are not used.

Example embodiments have been described above with the aid of method steps illustrating the performance of specified functions and relationships thereof. The boundaries and sequence of these functional building blocks and method steps have been defined herein for convenience of description. Alternate boundaries and sequences can be defined, so long as the specified functions and relationships are appropriately performed. Any such alternate boundaries or sequences are thus within the scope and spirit of the claims.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination of two or more of A, B, and C. Likewise, A and/or B means A, B, or A and B.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A method of operating a storage controller which includes a volatile memory device, the method comprising: determining whether a low-power mode is available, based on validity bitmap information indicating invalidity of first data stored in a first memory region of a first sub-block of the volatile memory device and validity of second data stored in a second memory region of a second sub-block of the volatile memory device, wherein a size of each of the first sub-block and the second sub-block is a minimum size capable of supporting a refresh operation of the volatile memory device; overwriting the second data to the first memory region based on the validity bitmap information, in response to determining that the low-power mode is available; storing first mapping information including a fixed index value corresponding to the first memory region and a migration index value corresponding to the overwritten second data in a metadata table; and after overwriting the second data, performing a partial refresh operation corresponding to the first sub-block.

2. The method of claim 1, wherein the performing the partial refresh operation corresponding to the first sub-block after overwriting the second data includes:

performing a refresh operation on only the first sub-block among the first sub-block and the second sub-block.

3. The method of claim 1, wherein the validity bitmap information further indicates validity of third data stored in a third memory region of the first sub-block, and wherein, before the partial refresh operation is performed, the third memory region is not overwritten by another valid data.

4. The method of claim 1, wherein the validity bitmap information further indicates invalidity of third data stored in a third memory region of the first sub-block and validity of fourth data stored in a fourth memory region of a third sub-block of the volatile memory device, and wherein the method further comprises before the partial refresh operation is performed, over-writing the fourth data based on the validity bitmap information, in the third memory region in response to determining that the low-power mode is available, and before the partial refresh operation is performed, storing second mapping information including a fixed index value corresponding to the third memory region and a migration index value corresponding to overwritten fourth data in the metadata table.

5. The method of claim 1, further comprising:

before determining whether the low-power mode is available, updating the validity bitmap information based on a write operation or a delete operation.

6. The method of claim 1, wherein the determining whether the low-power mode is available based on the validity bitmap information includes:

counting at least one valid memory region among a plurality of memory regions corresponding to the validity bitmap information, wherein the plurality of memory regions include the first memory region and the second memory region and the at least one valid memory region includes the second memory region;

selecting at least one active sub-block, in which the partial refresh operation is to be performed, from among a plurality of sub-blocks corresponding to the plurality of memory regions, wherein the plurality of sub-blocks include the first sub-block and the second sub-block and the at least one active sub-block includes the first sub-block; and determining whether a condition of the low-power mode is satisfied, based on the at least one valid memory region thus counted and the at least one active sub-block thus selected.

7. The method of claim 6, further comprising:

before the second data are overwritten in the first memory region, finding the second memory region of the second sub-block in response to determining that the condition of the low-power mode is satisfied;

before the second data are overwritten in the first memory region, finding the first memory region of the first sub-block in response to determining that the condition of the low-power mode is satisfied; and after storing the first mapping information in the metadata table, determining whether all of at least one data stored in the at least one valid memory region are completely collected to the at least one active sub-block, wherein the performing the partial refresh operation corresponding to the first sub-block after overwriting the second data includes performing the partial refresh operation in response to determining that all of the at least one data are completely collected to the active sub-block.

8. The method of claim 6, further comprising:

before determining whether the low-power mode is available, receiving power limit information from an external host device or an internal firmware module; and before determining whether the low-power mode is available, receiving a low-power mode command from the external host device or the internal firmware module, wherein the condition of the low-power mode is determined based on the power limit information.

9. The method of claim 8, further comprising:

after performing the partial refresh operation, returning a success response to the external host device or the internal firmware module; and returning a failure response to the external host device or the internal firmware module in response to determining that the low-power mode is unavailable.

10. The method of claim 9, further comprising:

performing, by the storage controller, in-band-communication with the external host device and out-of-band communication with the external host device indirectly through a micro controller unit (MCU);

selecting, by the storage controller, one of the in-band-communication and the out-of-band communication as a communication method; and transmitting or receiving, by the storage controller, at least one of the power limit information, the low-power mode command, the success response, and the failure response based on a selected communication method.

11. The method of claim 1, further comprising:

after performing the partial refresh operation, receiving a low-power mode exit command from an external host device or an internal firmware module;

performing a full refresh operation corresponding to the first sub-block and the second sub-block in response to receiving the low-power mode exit command;

after performing the full refresh operation, copying the second data stored in the first memory region to the second memory region based on the first mapping information;

determining whether all of at least one valid memory region among a plurality of memory regions corresponding to the validity bitmap information are completely restored; and returning a done response to the external host device or the internal firmware module in response to determining that all of the at least one valid memory region is completely restored.

12. The method of claim 11, further comprising performing, by the storage controller, in-band-communication with the external host device and out-of-band communication with the external host device indirectly through an MCU;

selecting, by the storage controller, one of the in-band-communication and the out-of-band communication as a communication method; and transmitting or receiving, by the storage controller, at least one of the low-power mode exit command and the done response based on a selected communication method.

13. The method of claim 1, wherein the refresh operation includes maintaining an amount of charge of a capacitor in a memory cell of a DRAM.

14. The method of claim 1, wherein the volatile memory device includes a plurality of memory channels, wherein each of the plurality of memory channels is connected to a plurality of memory chips through a plurality of memory ways, wherein each of the plurality of memory chips includes a plurality of memory blocks, wherein each of the plurality of memory blocks includes a plurality of sub-blocks, and wherein the first sub-block and the second sub-block are some of the plurality of sub-blocks.

15. A storage controller comprising: a volatile memory device including a first sub-block including a first memory region configured to store first data and a second sub-block including a second memory region configured to store second data; a validity bitmap register configured to store validity bitmap information indicating invalidity of the first data and validity of the second data; a metadata table; and processing circuitry configured to implement a refresh manager, wherein the refresh manager is configured to determine whether a low-power mode is available, based on the validity bitmap information, overwrite the second data to the first memory region based on the validity bitmap information, in response to determining that the low-power mode is available, store mapping information including a fixed index value corresponding to the first memory region and a migration index value corresponding to the overwritten second data in the metadata table, and after overwriting the second data, perform a partial refresh operation corresponding to the first sub-block, and wherein a size of each of the first sub-block and the second sub-block is a minimum size capable of supporting a refresh operation of the volatile memory device.

16. The storage controller of claim 15, wherein the refresh manager is further configured to:

perform the partial refresh operation only for the first sub-block among the first sub-block and the second sub-block.

17. The storage controller of claim 15, wherein the refresh manager is further configured to:

receive a low-power mode exit command from an external host device or an internal firmware module;

perform a full refresh operation corresponding to the first sub-block and the second sub-block in response to receiving the low-power mode exit command; and after performing the full refresh operation, copy the second data stored in the first memory region to the second memory region based on the mapping information.

18. A storage device comprising:
a non-volatile memory device; and
a storage controller configured to store user data in the non-volatile memory device,
wherein the storage controller includes:
a volatile memory device including a first sub-block including a first memory region configured to store first data and a second sub-block including a second memory region configured to store second data;
a validity bitmap register configured to store validity bitmap information indicating invalidity of the first data and validity of the second data;
a metadata table; and
processing circuitry configured to implement a refresh manager,
the refresh manager is further configured to
determine whether a low-power mode is available, based the validity bitmap information,
overwrite the second data to the first memory region based on the validity bitmap information, in response to determining that the low-power mode is available,
store mapping information including a fixed index value corresponding to the first memory region and a migration index value corresponding to the overwritten second data in the metadata table, and
after overwriting the second data, perform a partial refresh operation corresponding to the first sub-block,
wherein the first data and the second data are temporarily buffered data of the user data or include logical-to-physical mapping information corresponding to the user data, and
wherein a size of each of the first sub-block and the second sub-block is a minimum size capable of supporting a refresh operation of the volatile memory device.

19. The storage device of claim 18, further comprising:
a micro controller unit (MCU) configured to communicate with the storage controller,
wherein the storage controller supports in-band-communication with an external host device,
wherein the MCU supports out-of-band communication with the external host device, and
wherein the storage controller is further configured to
select one of the in-band-communication and the out-of-band communication, and
provide the external host device with a success response indicating that the low-power mode is applied, through the selected one.

20. The storage device of claim 19, wherein the storage controller supporting the in-band-communication is driven based on a first power supply voltage received from the external host device,
wherein the MCU supporting the out-of-band communication is driven based on a second power supply voltage received from the external host device, and
wherein the second power supply voltage is lower than the first power supply voltage and is a constant voltage.

* * * * *